(12) United States Patent
Hofmann et al.

(10) Patent No.: US 10,551,731 B2
(45) Date of Patent: Feb. 4, 2020

(54) GLASS CERAMIC FOR ULTRAVIOLET LITHOGRAPHY AND METHOD OF MANUFACTURING THEREOF

(71) Applicant: Applied Materials, Inc., Santa Clara, CA (US)

(72) Inventors: Ralf Hofmann, Soquel, CA (US); Majeed Foad, Sunnyvale, CA (US); Cara Beasley, Scotts Valley, CA (US)

(73) Assignee: Applied Materials, Inc., Santa Clara, CA (US)

( * ) Notice: Subject to any disclaimer, the term of this patent is extended or adjusted under 35 U.S.C. 154(b) by 491 days.

(21) Appl. No.: 15/107,054

(22) PCT Filed: Dec. 19, 2014

(86) PCT No.: PCT/US2014/071690
§ 371 (c)(1),
(2) Date: Jun. 21, 2016

(87) PCT Pub. No.: WO2015/095803
PCT Pub. Date: Jun. 25, 2015

(65) Prior Publication Data
US 2016/0377972 A1 Dec. 29, 2016

Related U.S. Application Data

(60) Provisional application No. 61/919,780, filed on Dec. 22, 2013.

(51) Int. Cl.
*C23C 16/34* (2006.01)
*G03F 1/22* (2012.01)
(Continued)

(52) U.S. Cl.
CPC .............. *G03F 1/22* (2013.01); *C03C 17/245* (2013.01); *C23C 16/345* (2013.01);
(Continued)

(58) Field of Classification Search
CPC .......................... C23C 16/345; C23C 16/401
See application file for complete search history.

(56) References Cited

U.S. PATENT DOCUMENTS 6,835,503 B2   12/2004   Krauth
7,524,735 B1   4/2009   Gauri et al.
(Continued)

FOREIGN PATENT DOCUMENTS

CN   1900359 A   1/2007
JP   2005231994   2/2005
(Continued)

OTHER PUBLICATIONS

International Search Report and Written Opinion in International Application No. PCT/US2014/071690, dated Apr. 1, 2015, 11 pages.
(Continued)

*Primary Examiner* — Elizabeth A Burkhart
(74) *Attorney, Agent, or Firm* — Servilla Whitney LLC

(57) ABSTRACT

An extreme ultraviolet mask and method of manufacture thereof includes: providing a glass-ceramic block; forming a glass-ceramic substrate from the glass-ceramic block; and depositing a planarization layer on the glass-ceramic substrate.

14 Claims, 7 Drawing Sheets

(51) Int. Cl.
    *C23C 16/40*     (2006.01)
    *C03C 17/245*     (2006.01)

(52) U.S. Cl.
    CPC ...... C23C 16/401 (2013.01); *C03C 2217/213* (2013.01); *C03C 2218/152* (2013.01)

(56) References Cited

U.S. PATENT DOCUMENTS

| | | | |
|---|---|---|---|
| 9,097,994 B2 | 8/2015 | Babu et al. | |
| 2003/0164998 A1* | 9/2003 | Mirkarimi | B82Y 10/00 |
| | | | 359/237 |
| 2003/0194615 A1* | 10/2003 | Krauth | B82Y 10/00 |
| | | | 430/5 |
| 2004/0151988 A1 | 8/2004 | Silverman | |
| 2005/0084773 A1 | 4/2005 | Krauth | |
| 2005/0197424 A1 | 9/2005 | Mitra et al. | |
| 2007/0020903 A1 | 1/2007 | Takehara et al. | |
| 2007/0240453 A1* | 10/2007 | Uno | B82Y 10/00 |
| | | | 65/102 |
| 2009/0031953 A1* | 2/2009 | Ingle | C23C 16/401 |
| | | | 118/723 R |
| 2011/0111137 A1* | 5/2011 | Liang | C23C 16/345 |
| | | | 427/579 |
| 2012/0147353 A1 | 6/2012 | Lafarre et al. | |
| 2013/0209924 A1* | 8/2013 | Babu | G03F 1/72 |
| | | | 430/5 |

FOREIGN PATENT DOCUMENTS

| | | |
|---|---|---|
| JP | 2008016823 | 1/2008 |
| JP | 2008118118 | 5/2008 |

OTHER PUBLICATIONS

PCT International Preliminary Report on Patentability in PCT/US2014/071690 dated Jun. 28, 2016, 9 pages.

Akimune, Yoshio, et al., "Characterization of $Si_3N_4$ Surface after Excimer Laser Radiation", Journal of the Ceramic Society of Japan, 103[2], pp. 128-131 (1995).

* cited by examiner

GLASS CERAMIC FOR ULTRAVIOLET LITHOGRAPHY AND METHOD OF MANUFACTURING THEREOF

CROSS-REFERENCE TO RELATED APPLICATIONS

This application is the national phase application of PCT Patent Application PCT/US2014/071690, filed Dec. 19, 2014, which claims the benefit of U.S. Provisional Patent Application Ser. No. 61/919,780 filed Dec. 22, 2013. The subject matter thereof is incorporated herein by reference.

TECHNICAL FIELD

The present invention relates generally to a glass-ceramic for extreme ultraviolet lithography systems.

BACKGROUND

Extreme ultraviolet lithography (EUVL, also known as soft x-ray projection lithography) is a contender to replace deep ultraviolet lithography for the manufacture of 0.13 micron, and smaller, minimum feature size semiconductor devices.

However, extreme ultraviolet light, which is generally in the 5 to 40 nanometer wavelength range, is strongly absorbed in virtually all materials. For that reason, extreme ultraviolet (EUV) systems work by reflection rather than by transmission of light. Through the use of a series of mirrors, or lens elements, and a reflective element, or mask blank, coated with a non-reflective absorber mask pattern, the patterned actinic light is reflected onto a resist-coated semiconductor wafer.

The lens elements and mask blanks of extreme ultraviolet lithography systems are coated with reflective multilayer coatings of materials such as molybdenum and silicon. Reflection values of approximately 65% per lens element, or mask blank, have been obtained by using substrates with coatings that strongly reflect EUV light.

There are various classes of defects in semiconductor processing technology which cause problems in masks. Opaque defects are typically caused by particles on top of the multilayer coatings or mask pattern which absorb light when it should be reflected. Clear defects are typically caused by pinholes in the mask pattern on top of the multilayer coatings through which light is reflected when it should be absorbed. Phase defects are typically caused by scratches and surface variations beneath the multilayer coatings which cause transitions in the phase of the reflected light.

These phase transitions result in light wave interference effects which distort or alter the pattern that is to be exposed in the resist on the surface of the semiconductor wafer. While progress has been made in reducing or eliminating particle defects and work has been done on repair of opaque and clear defects in masks, to date nothing has been done to address the problem of phase defects.

In the past, mask blanks for deep ultraviolet lithography have generally been of glass but silicon or ultra low thermal expansion materials have been proposed as alternatives for extreme ultraviolet lithography. Whether the blank is of glass, ultra low thermal expansion material, or silicon, the surface of the mask blank is made as smooth as possible by mechanical polishing with an abrasive. The scratches that are left behind in such a process are sometimes referred to as "scratch-dig" marks, and their depth and width depend upon the size of the particles in the abrasive used to polish the mask blank. For visible and deep ultraviolet lithography, these scratches are too small to cause phase defects in the pattern on the semiconductor wafer. However, for extreme ultraviolet lithography, scratch-dig marks are a significant problem because they will appear as phase defects.

Due to the short illumination wavelengths required for EUV lithography, the pattern masks used must be reflective masks instead of the transmissive masks used in current lithography. The reflective mask is made up of a precise stack of alternating thin layers of molybdenum and silicon, which creates a Bragg refractor or mirror. Because of the nature of the multilayer stack and the small feature size, any imperfections in the surface of the substrate on which the multilayer stack is deposited will be magnified and impact the final product. Imperfections on the scale of a few nanometers can show up as printable defects on the finished mask and need to be eliminated from the surface of the mask blank before deposition of the multilayer stack.

Common imperfections include pits, scratches, and particles. Common cleaning techniques remove many of the particles but either generate new pits or amplify existing pits. The pits can come from the polishing or cleaning process or can be from inclusions or flaws in the substrate material itself that are exposed during the cutting and polishing process. Further polishing can be used to remove the pits at the surface, but there is a risk that new pits will be exposed or caused in the process, which limits the usefulness of using polishing alone to smooth and planarize the substrate surface. Another method for substrate smoothing is laser or plasma annealing. These techniques melt and reflow a thin surface layer of the glass substrate, removing local defects. The problem is that they induce longer range roughness or ripples in the substrate surface and so do not provide the substrate flatness required for EUV masks.

In view of the need for the increasingly smaller feature size of electronic components, it is increasingly critical that answers be found to these problems. In view of the ever-increasing commercial competitive pressures, along with growing consumer expectations, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

SUMMARY

The present invention provides a method of manufacture of an extreme ultraviolet substrate including: providing a glass-ceramic block; forming a glass-ceramic substrate from the glass-ceramic block; and depositing a planarization layer on the glass-ceramic substrate.

The present invention provides integrated extreme ultraviolet blank production system including: a vacuum chamber for placing a glass-ceramic substrate in a vacuum; a first deposition system for depositing a planarization layer over the glass-ceramic substrate; and a second deposition system for depositing a multi-layer stack on the planarization layer without removing the glass-ceramic substrate from the vacuum.

Certain embodiments of the invention have other steps or elements in addition to or in place of those mentioned above. The steps or element will become apparent to those skilled in the art from a reading of the following detailed description when taken with reference to the accompanying drawings.

DETAILED DESCRIPTION

Figure 1:
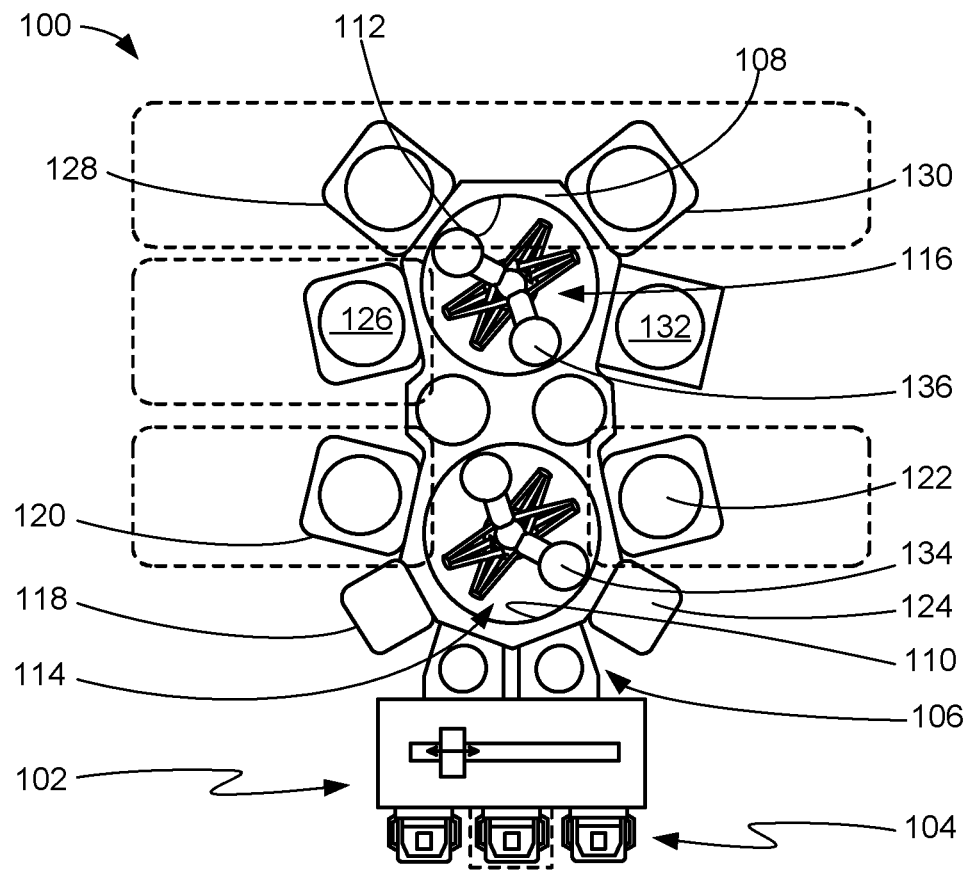
FIG. 1 is an integrated extreme ultraviolet mask production system.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known components and circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features will be described with similar reference numerals.

For expository purposes, the term "horizontal" as used herein is defined as a plane parallel to the plane or surface of a mask blank, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" indicates that there is direct contact between elements.

The term "processing" as used herein includes deposition of material or photoresist, patterning, exposure, development, etching, cleaning, and/or removal of the material or photoresist as required in forming a described structure.

The present invention is a system and method for the planarization of substrates, such as glass-ceramic substrates for use in Extreme Ultraviolet lithography (EUV/EUVL), which is also known as soft x-ray projection lithography. EUV can be used to produce smaller, minimum feature sized semiconductor devices.

Although glass-ceramics include many properties that are highly suitable for EUVL applications, there are crystalline phases in glass-ceramics that make them not completely amorphous. The surface of glass-ceramics may be too rough, especially after polishing to meet the design and dimensional specifications of EUVL systems. It has been found that a planarization layer, such as a layer from a CVD process can be used to overcome the polishing and roughness limitations of glass-ceramics.

Referring now to FIG. 1, therein is shown an integrated extreme ultraviolet mask production system 100. The integrated EUV mask production system 100 includes a substrate loading and carrier handling system 102 into which substrates 104 are loaded. A frontend interface or an airlock 106 provides access to a wafer handling vacuum chamber 108.

The function of the frontend interface is to move the substrates 104 between load-ports to the mainframe or wafer handling vacuum chamber 108. The chambers of the integrated EUV mask production system 100 can include a vacuum or atmospheric pressure.

In the embodiment shown, the wafer handling vacuum chamber 108 contains two vacuum chambers, a first vacuum chamber 110 and a second vacuum chamber 112. Within the first vacuum chamber 110 is a first wafer handling system 114 and in the second vacuum chamber 112 is a second wafer handling system 116.

The wafer handling vacuum chamber 108 or mainframe has a plurality of ports and deposition chambers around its periphery for attachment of various other systems. The first vacuum chamber 110 has a degas system 118, a first physical vapor deposition system 120, a second physical vapor deposition system 122, and a preclean system 124.

The second vacuum chamber 112 has a first multi-cathode source 126, a flowable chemical vapor deposition (FCVD) system 128, a cure system 130, and a second multi-cathode source 132 connected to it.

The first wafer handling system 114 is capable of moving wafers, such as a wafer 134, among the airlock 106 and the various systems around the periphery of the first vacuum chamber 110 and through slit valves in a continuous vacuum. The second wafer handling system 116 is capable of moving wafers, such as a second wafer 136, around the second vacuum chamber 112 while maintaining the wafers in a continuous vacuum. It has been discovered that the integrated EUV mask production system 100 provides the ideal environment for manufacturing EUV masks.

Figure 2:
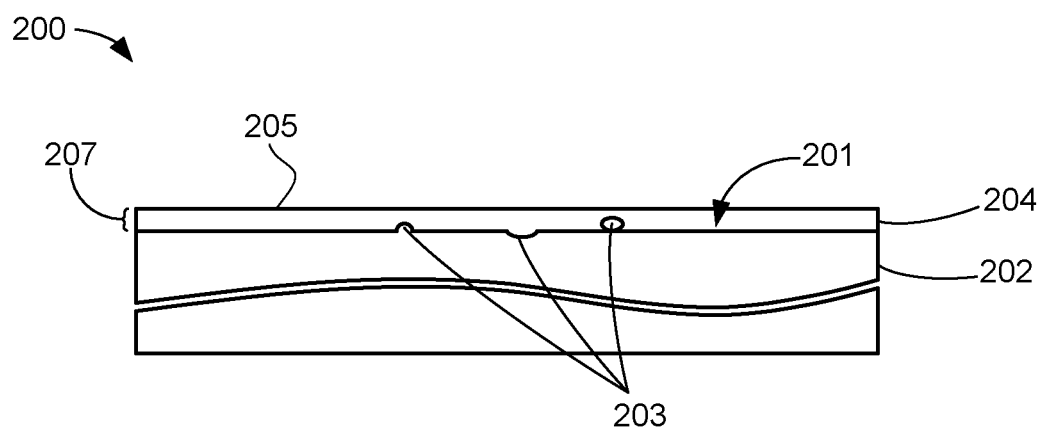
FIG. 2 is a cross-sectional view of a base portion of an EUV mask in accordance with an embodiment of the present invention.

Referring now to FIG. 2, therein is shown a cross-sectional view of a base portion 200 of an EUV mask in accordance with an embodiment of the present invention. The base portion 200 can include a glass-ceramic substrate 202 and a planarization layer 204.

The glass-ceramic substrate 202 can include a polycrystalline material. For example, the glass-ceramic substrate 202 can include Zerodur or other glass-ceramic material having an ultra-low coefficient of thermal expansion. The glass-ceramic substrate 202 can include lithium aluminosilicate and can include a coefficient of thermal expansion (CTE) of plus or minus $0.007 \times 10^{-7}$/K. It has been found that a CTE of plus or minus $0.007 \times 10^{-7}$/K is needed for substrates used in EUVL systems because the ultra-low coefficient of thermal expansion prevents distortion to the printed image onto minimum semiconductor devices during the EUV projection lithography process.

The glass-ceramic substrate 202 can include a high three-dimensional homogeneity with few inclusions, bubbles, and internal stria. The glass-ceramic substrate 202 can be non-porous and have a high affinity for coatings. For example, it has been found that the glass-ceramic substrate 202 can include a material which is highly resistant to acids and alkali. Because of the resistance to acids and alkali, it has been found that the glass-ceramic substrate 202, such as Zerodur, provides a strong and resistant surface for substrates that undergo repeated coatings, deposition steps, treatments, etching, or a combination thereof.

Substrates used in EUVL require a very low high spacial frequency roughness (HSFR) to prevent defects in the lithography printing process. Glass-ceramic structures make polishing to achieve a low HSFR difficult because the polishing of glass-ceramic structures results in the generation of pits and defects in the glass surface, which also negatively impacts the lithography printing process.

A substrate top surface 201 of the glass-ceramic substrate 202 can include imperfections 203, such as pits, scratches, and particles, which result from a polishing method such as chemical mechanical polishing (CMP) with an abrasive. The scratches that are left behind in such a process are sometimes referred to as "pits" and/or "scratch-dig" marks, and their depth and width depend upon the size of the particles in the abrasive used to polish the glass-ceramic substrate 202.

A planarization layer 204 can be formed on the substrate top surface 201 in order to achieve the low HSFR and overall global flatness required in EUVL systems. The planarization layer 204 can include flowable chemical vapor deposition (CVD) films including a low-k dielectric. The planarization layer 204 can include a layer thickness 207 or layer width of a range of 100 angstroms (Å) to 10 micrometers (μm).

The planarization layer 204 can include a silicon carbon oxygen film, a silicon nitrogen film, or a combination thereof. Further, the planarization layer 204 can include a non-carbon liquid flowable CVD (FCVD) with a 30:1 aspect ratio. The planarization layer 204 can be cured in subsequent manufacturing steps. It has been discovered that the use of a silicon carbon oxygen film for the planarization layer 204 allows for UV curing, which reduces the risk of particles that may cause defects to the EUVL mask.

The planarization layer 204 of CVD film is locally flowable to fill in or bury any of the imperfections 203 on the glass-ceramic substrate 202 after polishing. It has been found that the glass-ceramic substrate 202 with the planarization layer 204 results in a final surface that is flat and smooth. For example, a layer top surface 205 of the planarization layer 204 can produce a surface roughness of under 0.6 nanometers (nm) root means square (rms). The surface roughness, such as the HSFR in particular, is lower than the starting roughness of the glass-ceramic substrate 202.

The precursors used for the planarization layer 204 can include tetraethyl orthosilicate (TEOS), tetramethyl orthosilicate (TMOS), octamethylcyclotetrasiloxane (OMCTS), trisiylamine (TSA), similar CVD/FCVD compound, or combination thereof for producing a flowable deposition layer that planarizes the surface of the substrate top surface 201 without changing the properties the glass-ceramic substrate 202.

It has been discovered that the planarization layer 204 can achieve a surface roughness of under 0.6 nanometers rms regardless of the starting roughness of the glass-ceramic substrate 202. The flowable properties of the planarization layer 204 fill in and bury any of the imperfections 203 that may exist on the substrate top surface 201. The planarization layer 204 can also equalize the global flatness of the substrate top surface 201. Thus the planarization layer 204 can overcome the polish resistant problems of glass-ceramic materials, such as Zerodur.

Further, it has been found that the flowable CVD films of the planarization layer 204 can be deposited on glass-ceramics, such as Zerodur, in order to smoothen or planarize surface defects such as pits, particles, and scratches. The flowable CVD films can be deposited in a vacuum chamber utilizing a low k (SiCO) or similar chemistry. A low k refers to a low-k dielectric, which is a material with a small dielectric constant relative to silicon dioxide.

For example, the CVD film can include compounds with silicon, oxygen, carbon, nitrogen, or a combination thereof, which can flow to provide a layer having a local roughness of under 0.6 nm rms. The CVD film is locally flowable and so fills or buries substrate defects while producing a final surface that is flat and smooth.

The surface roughness, or HSFR in particular, is lower than the starting glass-ceramic substrate. It has been found that this method of planarizing the glass-ceramic substrate 202 allows the substrate to be utilized for applications that require a lower HSFR than is possible by polishing alone. Another inventive advantage of using the planarization layer 204, with TEOS, TMOS, OMCTS, TSA, or a combination thereof, on the glass-ceramic substrate 202 is that the planarization layer 204 does not directly react with the glass-ceramic substrate 202 and thus provides planarization benefits without changing the desired properties of the glass-ceramic substrate 202. It has been found that the planarization layer 204 can provide low HSFR, increased structural stability for the substrate, and increased stress protection to the glass-ceramic substrate 202.

The flowable CVD planarization can be used following any polishing step to ready the surface for further deposition or use. The polishing used prior to the flowable CVD planarization or application of the planarization layer 204 does not impact the flowable CVD film and so the glass-ceramic substrate 202 can be polished to achieve the best possible global flatness without much concern for the HSFR that these polishing techniques result in.

The deposited flowable CVD film can either be deposited on immediately or it can be further smoothen using any polishing process, including CMP, ion beam polishing, and magneto rheological polishing. It has been found that the use of a CVD film having a low k, such as SiCO, for the planarization layer 204 provides durability and low cost materials for use on glass-ceramic substrates.

It has also been found that the planarization by the planarization layer 204 of the small pits, particles, and scratches from the flowable CVD film provides for greater reliability in devices created from the EUV process. Further, it has been discovered that the planarization layer 204 having a layer thickness 207 or layer width of 100 angstroms to 10 micrometers can smoothen or planarize the substrate top surface 201 without overburden and added bulk to the glass-ceramic substrate 202.

The present invention can include various techniques for depositing silicon, silicon oxide, and related films of compatible thermal expansion coefficient by CVD, physical vapor deposition (PVD), atomic layer deposition (ALD), and flowable CVD (FCVD) to fill the pits and bury the defects. Once deposited, the film's surface is smooth and flat enough for further multilayer stack deposition. The planarization layer 204 may be further smoothened using a variety of established smoothing or polishing techniques, including CMP, annealing, or ion beam polishing.

Figure 3A:
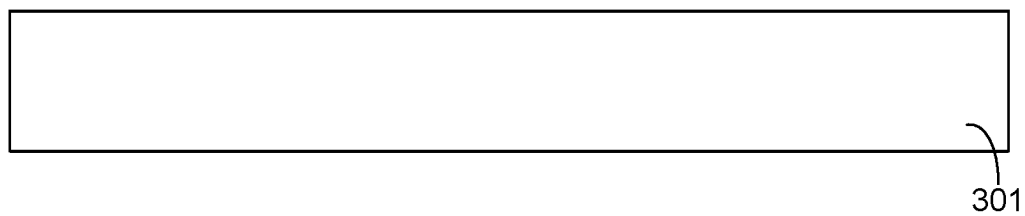
FIG. 3A is a glass-ceramic block in an initial EUV mask creation phase of manufacture.

Referring now to FIG. 3A, therein is shown a glass-ceramic block 301 in an initial EUV mask creation phase of manufacture. The glass-ceramic block 301 is a piece of glass-ceramic source material or large glass-ceramic blank, which can be provided.

The glass-ceramic block 301 can be a block or stock piece, which can need further processing to form a substrate for EUV mask creation. The glass-ceramic block 301 can be cut, shaped, and polished into a substrate that meets the design and manufacturing requirements of an EUVL system. For example, the glass-ceramic block 301 can be cut to form the glass-ceramic substrate 202 of FIG. 2.

Glass-ceramic materials provide temperature and CTE property advantages over the use of other ultra-low expansion glass (ULE). For example, glass-ceramics, such as Zerodur can be tuned to a much larger working temperature range whereas other ULE glasses have smaller working temperature ranges. The CTE uniformity in glass ceramics, such as Zerodur, are higher across a bulk than ULE glass. Further, it has been found that the larger working temperature range of glass ceramics, such as Zerodur, provide more options in controlling cooling rates.

Figure 3B:
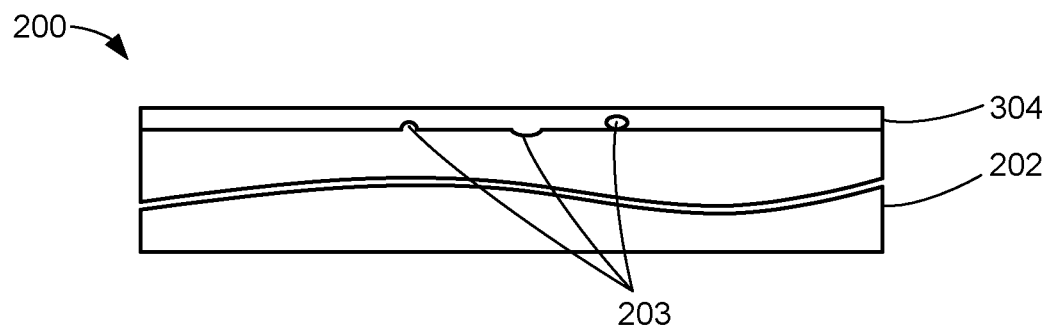
FIG. 3B is the base portion of FIG. 2 in a curing phase of manufacture.

Referring now to FIG. 3B, therein is shown the base portion 200 of FIG. 2 in a curing phase of manufacture. The base portion 200 can include the glass-ceramic substrate 202. The planarization layer 204 of FIG. 2 can be formed or deposited directly on the glass-ceramic substrate 202.

The glass-ceramic substrate 202 can include an uneven global flatness and the imperfections 203 from the shaping of the glass-ceramic block 301 of FIG. 3A. The planarization layer 204 can be used to smoothen or planarize the substrate top surface 201 of FIG. 2, which produces an even global flatness for the entire top surface and provides a layer having a local roughness of under 0.5 nm rms.

The planarization layer 204 is cured to form a hardened layer 304. The curing process can include an UV curing process or a stream process. The hardened layer 304 includes the same global flatness and the same local roughness as the planarization layer 204. Optionally, the hardened layer 304 can be further polished and planarized by a CMP process.

The planarization layer 204 can include a SiN film or a SiOC film. SiN film, once converted via curing to SiO/SiO$_2$, is more oxidation resistant and produces a harder film than alternative planarization layers. SiOC films require fewer processing steps to achieve a useable film. SiOC films are soft until cured, but can be used either cured or uncured. SiN films usually have to be cured before use but may result in a smoother film surface than SiOC. The polishing methods used on each type of the planarization layer 204 would be different. For example, SiOC film include fewer processing steps, which prevents particle contamination.

It has been found that the use of a UV curing process on SiOC films for the planarization layer 204 reduces the risk of particles being generated that may cause defects to occur during the deposition process. Steam or ozone curing must be used on SiN based films but may introduce added particles that may contaminate the chamber and substrate. It has been found that the SiN based film, after curing, is converted into SiO/SiO$_2$ for producing a more oxidation resistant and harder film for the layer directly over the glass-ceramic substrate 202. The resulting cured SiN film for the hardened layer 304 can produce a smoother top surface because the hardness of the cured SiN film facilitates further planarization of the hardened layer 304.

Further, it has been found that the use of SiOC requires fewer process steps to achieve a useable film over the glass-ceramic substrate 202. The SiOC film used for the planarization layer 204 is soft, which can include the option of curing or not curing. Films using SiN film require curing before subsequent deposition on the glass-ceramic substrate 202.

Figure 3C:
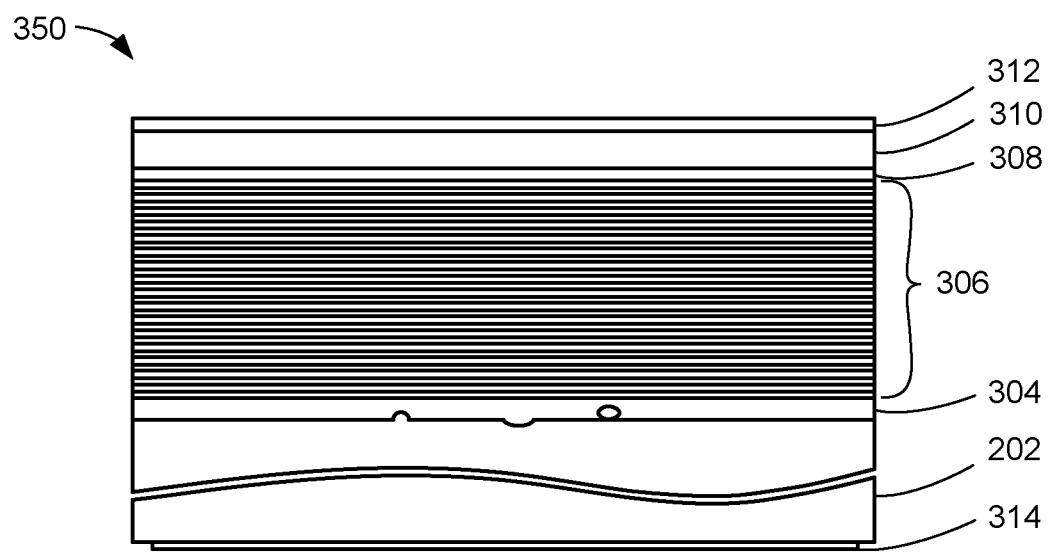
FIG. 3C is the structure of FIG. 3B in a stacking-formation phase of manufacture.

Referring now to FIG. 3C, therein is shown the structure of FIG. 3B in a stacking-formation phase of manufacture. The structure shown in FIG. 3C can include a partial view of the base portion 200 of FIG. 2 having a variety of layers formed thereon for forming an EUV mask 350. For example, the EUV mask 350 can include a multi-layer stack 306, a capping layer 308, an absorber layer 310, and an anti-reflective coating 312.

The multi-layer stack 306 can be formed over the hardened layer 304. The multi-layer stack 306 can be formed directly on the hardened layer 304 to form a Bragg reflector. Due to the reflective nature of the optics and illuminating wavelengths used in EUV, reflective optics are used and the multi-layer stack 306 may be made of alternating layers of high-z and low-z materials, such as molybdenum and silicon, which form a reflector.

The capping layer 308 is formed above the multi-layer stack 306. The capping layer can be a material such as ruthenium (Ru) or a non-oxidized compound thereof to help protect the multi-layer stack 306 from oxidation and any chemical etchants to which the EUV mask 350 may be exposed during mask processing. Other material such as titanium nitride, boron carbide, silicon nitride, ruthenium oxide, and silicon carbide may also be used in the capping layer 308.

The absorber layer 310 is placed over the capping layer 308. The absorber layer 310 is of a material having a high absorption coefficient for a particular frequency of EUV light (about 13.5 nm) and may be a material such chromium, tantalum or nitrides thereof.

The anti-reflective coating (ARC) 312 is deposited on the absorber layer 310. The ARC 312 can be of a material such as tantalum oxynitride or tantalum boron oxynitride. A backside chucking layer 314 can be formed on the rear surface of the glass-ceramic substrate 202 for chucking the substrate on or with an electrostatic chuck (not shown).

This embodiment of the present invention can include various techniques for depositing the different layers on the glass-ceramic substrate 202. For example, silicon, silicon oxide, Ru, and layers can be deposited using CVD, PVD, ALD, and flowable CVD.

Figure 4:
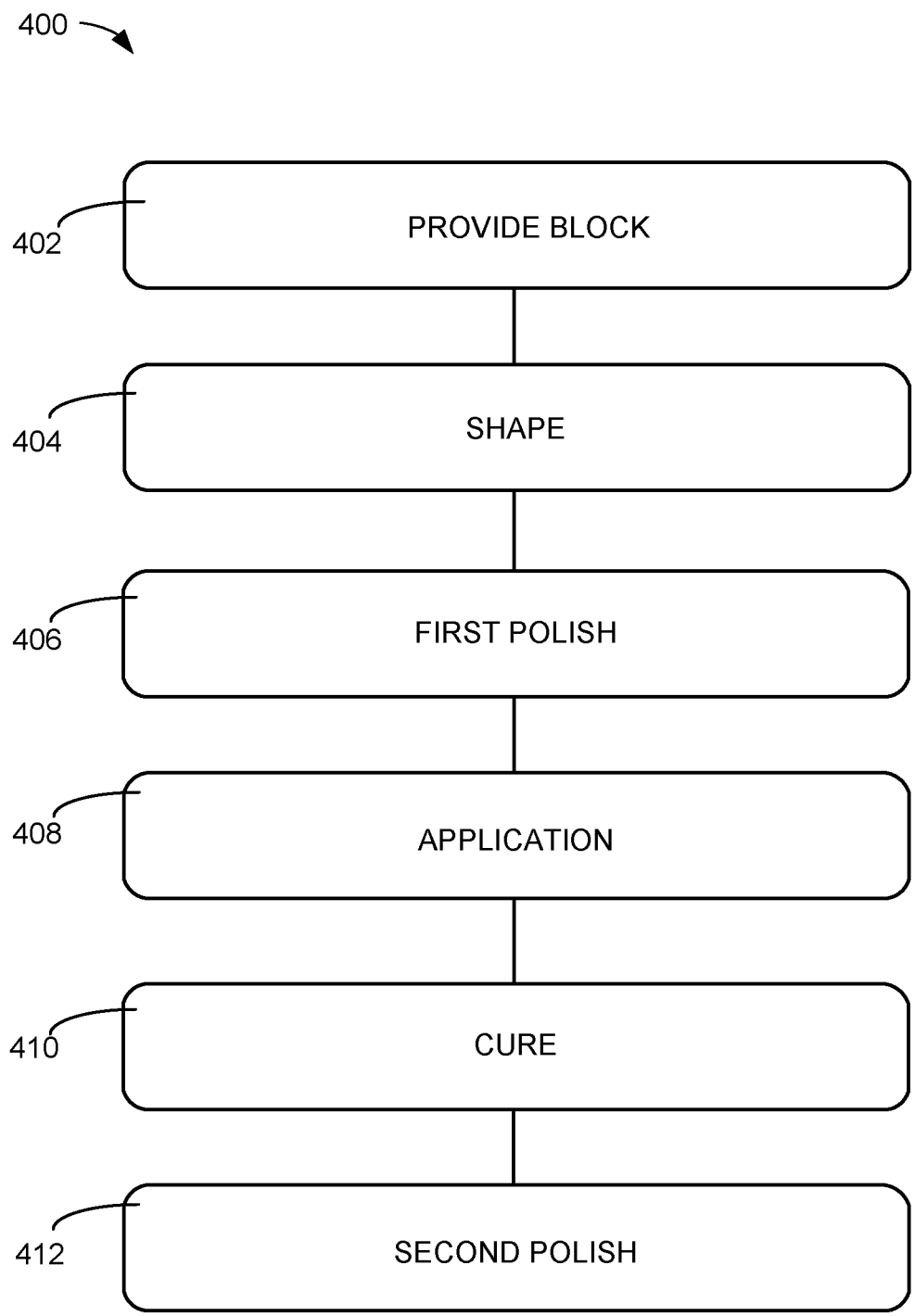
FIG. 4 is a method for manufacturing the base portion of FIG. 2 for the EUV mask of FIG. 3B.

Referring now to FIG. 4, therein is shown a method 400 for manufacturing the base portion 200 of FIG. 2 for the EUV mask 350 of FIG. 3B. The method 400 includes providing the glass-ceramic block 301 of FIG. 3A in a block 402. The glass-ceramic block 301 can include a large sheet of glass-ceramic material with a low CTE, such as Zerodur, or other ultra-low expansion glass material.

The glass-ceramic block 301 can be shaped for forming the glass-ceramic substrate 202 of FIG. 2 in a block 404. The shaping process can include cutting, sawing, drilling, water jet cutting, or a combination thereof. The glass-ceramic block 301 can be shaped and cut into a design specific shape, such as a substrate that will fit a chuck of an EUVL system. For example, the glass-ceramic block 301 can be cut into a six-inch long substrate.

The glass-ceramic substrate 202 can be polished in a block 406. The block 406 or first polish step can be optional based on the low HSFR requirements and the global flatness of the substrate top surface 201. The glass-ceramic substrate 202 can also be polished to reduce the layer thickness 207 of FIG. 2 to meet the chamber and chuck dimensional requirements of an EUVL system.

The planarization layer 204 can be formed or applied over the glass-ceramic substrate 202 in a block 408. The application step of the planarization layer 204 of FIG. 2 can include CVD, PLD, ALD, and flowable CVD methods to fill any pits and bury any defects on the substrate top surface 201.

The planarization layer 204 can be cured to form the hardened layer 304 of FIG. 3B in a block 410. The cure process can convert the planarization layer 204 into a more rigid film or layer. The cure process can include a UV curing process or thermal treatment for the planarization layer 204 of silicon oxygen carbon or of silicon nitrogen. The cure process can also include a steam or ozone treatment for replacing the nitrogen in the deposition layer with oxygen from the steam to create the hardened layer 304 having silicon oxide.

The hardened layer 304 can be polished in a block 412. The block 412 or second polish step can be optional based on the HSFR and global flatness of the substrate top surface 201. The glass-ceramic substrate 202 can also be polished to reduce the layer thickness 207 of FIG. 2.

The hardness of the hardened layer 304 determines the behavior of the layer during polishing. For example, harder films, such as films using SiN, may be more brittle and therefore more prone to surface cracking under some polishing conditions. Further, the harder films may not be as chemically resistant depending on the material used. Harder films may also affect the adhesion of the planarization layer 204 to the substrate. Further subsequent layers deposited on a very hard film variant of the planarization layer 204 may not adhere as efficiently. Further, the SiN film used for the planarization layer 204 requires more processing steps to achieve, which increase the risk of contamination by particles. It has been found that a SiOC film used for the planarization layer 204 minimizes the disadvantages mentioned above regarding very hard films formed from SiN.

It has been found that the hardened layer 304 provides a surface more susceptible to polishing without causing the imperfections and defects that are cause when polishing the substrate top surface 201 of FIG. 2. Further, it has been found that the hardened layer 304 makes additional polishing optional because the deposition and curing process used to form the hardened layer 304 provides a planarized surface with a local roughness under 0.6 nm rms.

Figure 5:
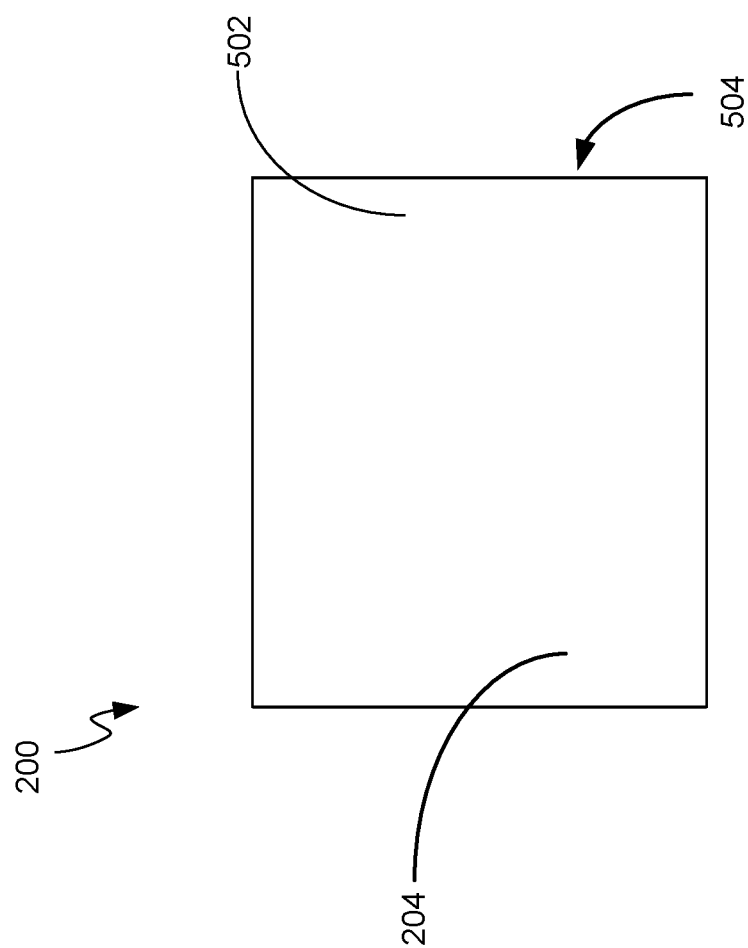
FIG. 5 is an example top view of the base portion 200 of FIG. 2.

Referring now to FIG. 5, therein is shown an example top view of the base portion 200 of FIG. 2. The example view includes a view of the top surface of the planarization layer 204 as shown using an atomic force microscopy (AFM) method.

Before deposition or application of the planarization layer 204, the glass-ceramic substrate 202 of FIG. 2 can have a surface roughness 502 of over one nm rms. The surface roughness 502 is a component of surface texture or surface morphology of the surface. For example, an unprocessed or off the shelf glass-ceramic substrate, such as a Zerodur glass-ceramic block 504, was found to have a surface roughness of 1.36 nm rms. The surface roughness 502 of the glass-ceramic substrate 202 can be determined with an AFM height sensor on a 4 μm by 4 μm portion.

After application of the planarization layer 204, it was discovered that the same 4 μm by 4 μm Zerodur sample had a surface roughness of 0.626 nm rms. Further, it have been discovered that the planarization layer 204 with a thickness of 100 Å to 10 μm can be formed on polished or unpolished substrates with varying degrees of the surface roughness 502 and can still produce the surface roughness 502 of below 0.6 nm rms for the layer top surface 205 of FIG. 2. This advantage of the planarization layer 204 can include yield and decrease manufacturing steps by removing some polishing steps.

Figure 6:
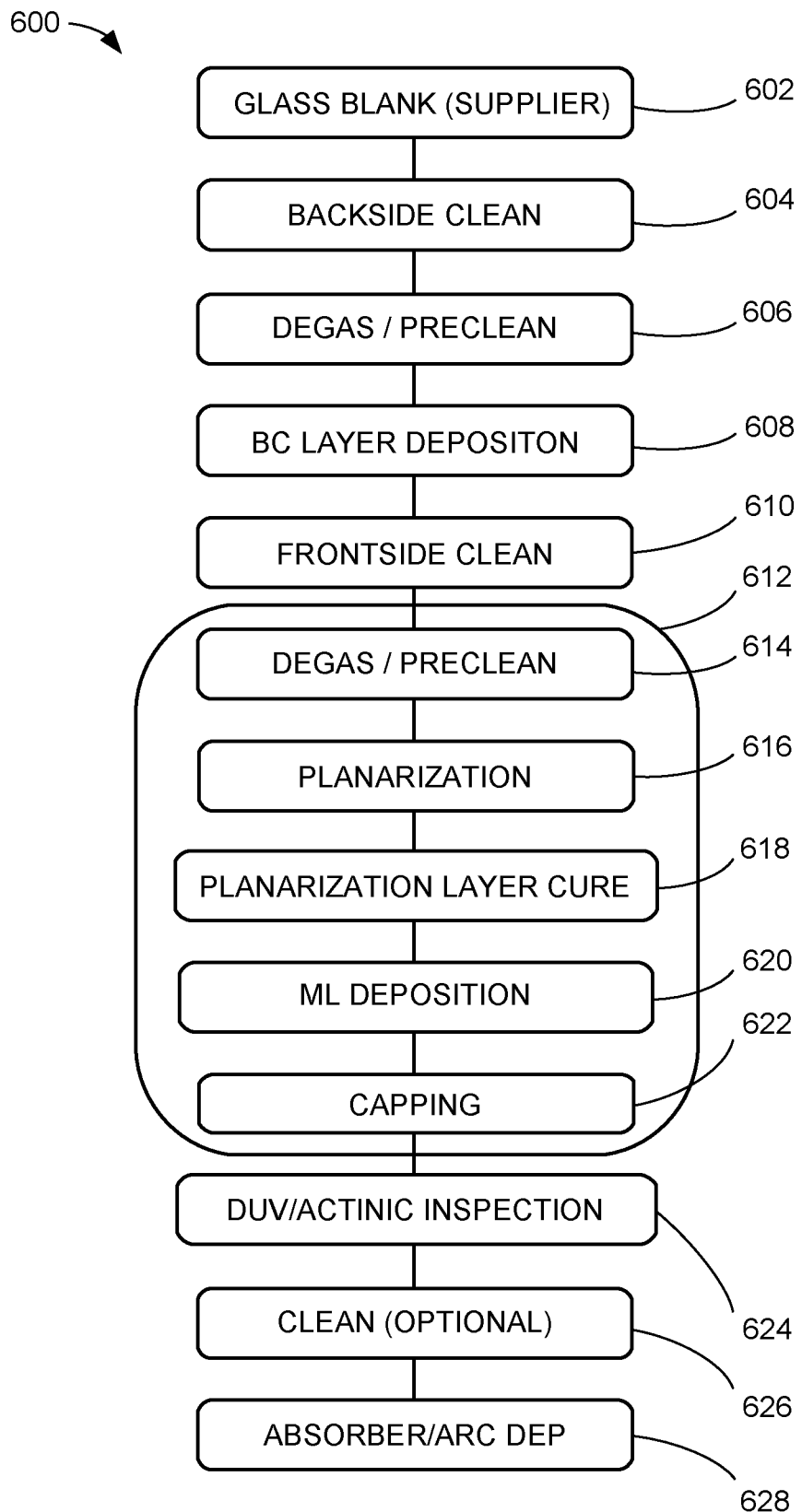
FIG. 6 is a method for making the EUV mask of FIG. 3C with ultra-low defects.

Referring now to FIG. 6, therein is shown a method 600 for making the EUV mask 350 of FIG. 3C with ultra-low defects. The ultra-low defects are substantially zero defects. The method 600 includes the glass blank being supplied in a block 602. The glass blank can be placed into a vacuum tool, such as the first vacuum chamber 110 of FIG. 1. The glass blank is backside cleaned in a block 604, degassed and precleaned in a block 606.

A backside chucking layer can be applied in a block 608 and a frontside clean can be performed in a block 610. Some method steps are better performed in the integrated EUV mask production system 100 of FIG. 1 while under continuous vacuum to avoid contamination from ambient conditions.

A degas and preclean is performed in a block 614 and planarization in a block 616. For example, the planarization layer 204 of FIG. 2 can be applied to the glass-ceramic substrate 202 in block 616. The application step can occur in a deposition chamber such as the flowable chemical vapor deposition system 128 of FIG. 1.

The planarization layer can be cured in a planarization layer cure block 618 and the multi-layer deposition is performed in a block 620. For example, the hardened layer 304 of FIG. 3 can be formed in the cure system 130 of FIG. 1 for curing the planarization layer 204 of FIG. 2. The capping layer 308 of FIG. 3C is deposited in a capping layer block 622.

Thereafter exiting the integrated EUV mask production system 100, a deep ultraviolet (DUV)/Actinic inspection is performed in a block 624, the mask blank is optionally cleaned in a block 626, and the absorber layer and anti-reflective coating are deposited in a block 628.

Figure 7:
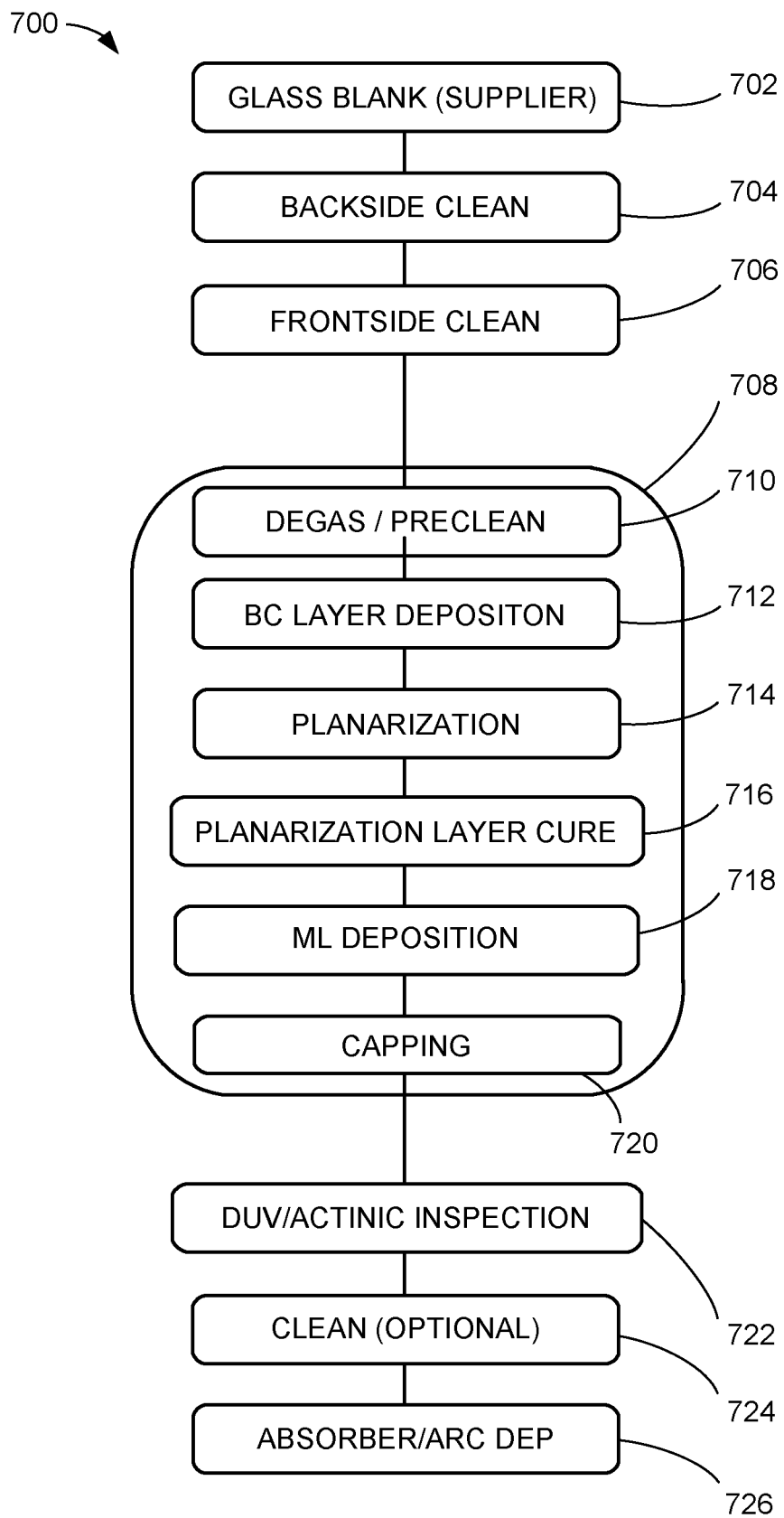
FIG. 7 is an alternative method for making the EUV mask of FIG. 3C.

Referring now to FIG. 7, therein is shown an alternative method 700 for making the EUV mask 350 of FIG. 3C. The ultra-low defects are substantially zero defects. The alternative method 700 begins with a glass blank being supplied in a block 702. The glass blank is backside cleaned in a block 704 and frontside cleaned in a block 706.

Some methods or process steps in block 708 are better performed in the integrated EUV mask production system 100 of FIG. 1 while under continuous vacuum to avoid contamination from ambient conditions.

The mask blank is degassed and precleaned in a block 710. The backside chucking layer 214 is deposited in a block 712 and planarization occurs in a block 714. The planarization layer is cured in a block 716. The multi-layer deposition is performed in a block 718 and the capping layer is applied in a block 720.

While the DUV/Actintic inspection may be performed inside the integrated EUV mask production system 100, it may also occur outside in a block 722. The mask blank is optionally cleaned in a block 724, and the absorber layer and anti-reflective coating may be deposited in a block 726.

Figure 8:
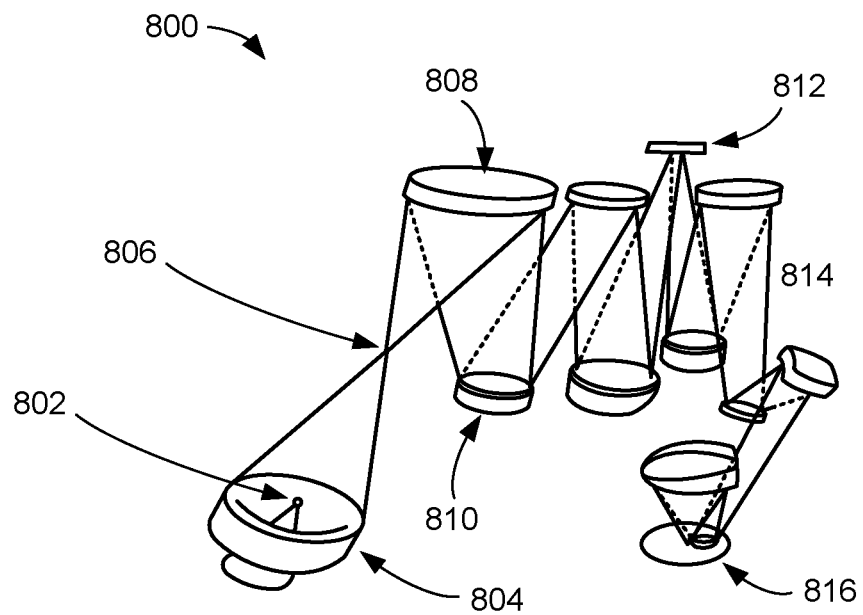
FIG. 8 is an optical train for an EUV lithography system.

Referring now to FIG. 8, therein is shown an optical train 800 for an EUV lithography system. The optical train 800 has an extreme ultraviolet light source, such as a plasma source 802, for creating the EUV light and collecting it in a collector 804. The collector 804 provides the light to a field facet mirror 808 which is part of an illuminator system 806 which further includes a pupil facet mirror 810. The illuminator system 806 provides the EUV light to a reticle 812 (which is the fully processed version of the EUV mask 350 of FIG. 3C), which reflects the EUV light through projection optics 814 and onto a wafer 816.

Figure 9:
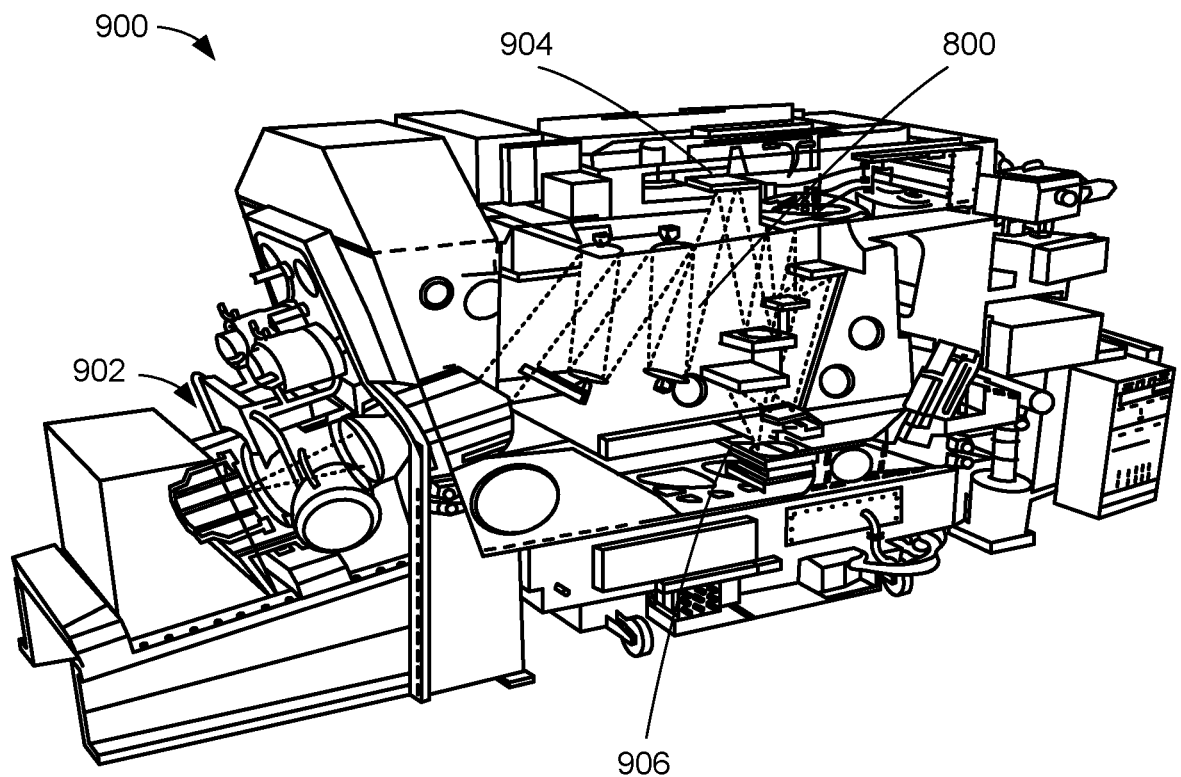
FIG. 9 is an EUV lithography system.

Referring now to FIG. 9, therein is shown an EUV lithography system 900. The EUV lithography system 900 includes an EUV light source area 902, a reticle stage 904 and a wafer stage 906 as adjuncts to the optical train 600. The EUVL lithography system 900 can include the optical train 800, which is shown in FIG. 8.

Embodiments of the present invention planarize and smooth EUV blanks so as to remove all pits, defects, and particles on the substrate surface so that the surface is atomically flat and smooth. The idea is to deposit defect free material on the surface of the EUV blank substrate that can then be processed without inducing any defects to achieve an atomically flat and smooth surface. The EUV mask 350 of FIG. 3C is a critical component of the EUV lithography system 900 and the EUV lithography system 900 cannot perform its function without an EUV mask on a properly planarized, flat, and smooth EUV blank. As such, it has been found that the planarization layer 204 of FIG. 2 properly smoothens or planarizes the layer top surface 205 of FIG. 2 for the surface roughness 502 of under 0.6 nm rms.

The first step is to fill any pits that are present; this can be done by depositing the planarization layer 204, which is a flowable CVD film. Further the planarization layer 204 can also include the methods of depositing silicon, silicon oxide, or related films via CVD, PVD, ALD, or a similar process. This planarization step will also bury particles, bumps, pits, and other defects that are on or in the EUV blank substrate surface. In the case of flowable CVD films, no further processing may be required to achieve an acceptably smooth, flat surface on the EUV blank substrate.

One advantage of the planarization layer 204 is that this method is substrate independent and can be used on a variety of substrates and qualities of substrates. It has the potential to make it possible to use glass-substrates that have the required properties for EUV blanks but do not have atomically flat, smooth surfaces after polishing. This independence makes it possible to use different substrate suppliers and minimizes the impact of unexpected changes to the substrate preparation and polishing by the suppliers.

Embodiments of the invention are targeted mainly at providing an atomically flat and smooth substrate surface for the manufacture of EUV masks, but it could be used for any application that requires an atomically flat, smooth surface, such as the EUV mask 350 and others.

Another approach would be to use flat highly thermally conducting surfaces to grow the multilayer stack on. Historically, glass is used as the substrate for masks, due to the transmissive nature of the optics and illuminating wavelengths used. EUV is absorbed by all materials, thus reflective optics is used. However, reflectivity is not 100% (<70% for current Mo/Si stack), and the absorbed part of the radiation will heat up the substrate. Current mask glass substrate compositions are optimized to give zero thermal expansion coefficient, at the operating temperature, to avoid pattern distortion during resist exposure.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance. These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacturing of an extreme ultraviolet mask blank comprising:
    forming a glass-ceramic substrate from a glass-ceramic block, the glass-ceramic block having a high spatial frequency roughness (HSFR) value;
    forming a liquid planarization layer on the glass-ceramic substrate using flowable chemical vapor deposition; and
    curing the planarization layer to form a hardened planarization layer,
    wherein the hardened planarization layer has a surface roughness of under 0.6 nm rms and an HSFR value lower than the HSFR value of the glass-ceramic substrate.

2. The method as claimed in claim 1 wherein the planarization layer comprises silicon, oxygen, and carbon.

3. The method as claimed in claim 1 wherein curing comprises using an ultraviolet curing process.

4. The method as claimed in claim 1 wherein the glass-ceramic substrate has a coefficient of thermal expansion of $\pm 0.007 \times 10^{-7}$/K.

5. The method of claim 1, wherein forming the planarization layer includes depositing a layer comprising silicon, oxygen, and carbon and curing the layer to form the hardened planarization layer on the glass-ceramic substrate.

6. The method of claim 5 wherein the glass-ceramic substrate has a coefficient of thermal expansion of $\pm 0.007 \times 10^{-7}$/K.

7. The method of claim 5, wherein the hardened planarization layer planarizes a surface of the glass-ceramic substrate without changing properties the glass-ceramic substrate.

8. The method of claim 5, wherein curing comprises steam or ozone curing.

9. The method of claim 5, wherein curing comprises ultraviolet curing.

10. The method of claim 5, wherein the glass-ceramic substrate comprises lithium alumino-silicate.

11. The method of claim 5, further comprising forming a multilayer stack which reflects extreme ultraviolet light on the hardened planarization layer.

12. The method of claim 1, wherein the planarization layer is a SiN based film, the method further comprising converting the SiN based film to a $SiO/SiO_2$ hardened planarization layer.

13. The method of claim 1, wherein the glass-ceramic substrate comprises lithium alumino-silicate.

14. The method of claim 1, further comprising forming a multilayer stack which reflects extreme ultraviolet light on the hardened planarization layer.

\* \* \* \* \*